United States Patent [19]
Takao

[11] Patent Number: 5,977,594
[45] Date of Patent: Nov. 2, 1999

[54] PROTECTING CIRCUIT FOR A SEMICONDUCTOR CIRCUIT

[75] Inventor: Noriyuki Takao, Tokyo, Japan

[73] Assignee: NEC Corporation, Tokyo, Japan

[21] Appl. No.: 09/092,939

[22] Filed: Jun. 8, 1998

[30] Foreign Application Priority Data

Jun. 9, 1997 [JP] Japan ..................................... 9-151109

[51] Int. Cl.[6] ........................... H01L 29/00; H01L 23/62; H01L 29/76; H01L 29/74
[52] U.S. Cl. ......................... 257/357; 257/355; 257/365; 257/173; 257/546
[58] Field of Search .................................... 257/355–363, 257/546, 547, 173; 327/313, 314, 325; 361/56, 111

[56] References Cited

U.S. PATENT DOCUMENTS

| | | | |
|---|---|---|---|
| 5,272,586 | 12/1993 | Yen .......................................... | 257/356 |
| 5,321,293 | 6/1994 | Mojaradi et al. ........................ | 257/357 |
| 5,698,886 | 12/1997 | Thenoz et al. ........................... | 257/355 |
| 5,760,630 | 6/1998 | Okamoto .................................. | 257/360 |
| 5,821,797 | 10/1998 | Kinugasa et al. ........................ | 257/355 |

FOREIGN PATENT DOCUMENTS

| | | | |
|---|---|---|---|
| 58165369 | 9/1983 | Japan ...................................... | 257/356 |
| 60-47454 | 3/1985 | Japan . | |
| 4-71265 | 3/1992 | Japan . | |
| 405102406 | 4/1993 | Japan ...................................... | 257/355 |
| 6-177339 | 6/1994 | Japan . | |

*Primary Examiner*—Tom Thomas
*Assistant Examiner*—Ori Nadav
*Attorney, Agent, or Firm*—Sughrue, Mion, Zinn, Macpeak & Seas, PLLC

[57] ABSTRACT

A protecting circuit is disclosed, that comprises a static electricity protecting means composed of a plurality of p channel type transistors, wherein a source electrode, a gate electrode, and a substrate electrode of a first p channel type transistor are connected to a high voltage power supply terminal, a drain electrode of a second p channel type MOS transistor being connected to a low voltage power supply terminal, a substrate electrode of the second p channel type substrate being connected to the high voltage power supply terminal, a drain electrode of the first p channel type transistor, a source electrode and a gate electrode of the second p channel type MOS transistor being connected to an external terminal and an internal circuit in common.

9 Claims, 6 Drawing Sheets

PROTECTING CIRCUIT FOR A SEMICONDUCTOR CIRCUIT

BACKGROUND OF THE INVENTION

1. Field of the Invention

The present invention relates to a protecting circuit for a semiconductor circuit, in particular, to a protecting circuit connected to an input terminal and an output terminal.

2. Description of the Related Art

Whenever semiconductor apparatuses are handled, in every situation such as fabrication, assembling, and operation, they should be potected against a breakdown due to static electricity. Static discharging results, for example, in deterioration of characteristics, breakdown of a junction, and damage of an oxide film. In recent years, the semiconductor devices have been drastically miniaturized. However, the miniaturization of semiconductor devices causes the resistance against the breakdown due to static electricity to deteriorate. Thus, countermeasures against the static discharging are becoming important.

In the most common example of a breakdown due to static electricity, static electricity that has been charged to a human body causes static discharge. On occasion, the charged voltage may amount to several 1000 V. This discharging may cause, for example, an electrode of a semiconductor device to melt, a P-N junction to break, and an oxide film to break down.

A semiconductor apparatus using MOS transistors has a gate electrode that is insulated from the transistors. Thus, especially, this semiconductor apparatus does not have a sufficient resistance against the breakdown due to static electricity. Consequently, countermeasures against static electricity are required. As a conventional method of such countermeasures, a protecting circuit is disposed between an input terminal and an input circuit so that the protecting circuit absorbs an excessive voltage.

A protecting circuit is composed of a resistor, a p-n diode, a combination of a resistor and a p-n diode, a combination of a resistor and a MOS diode, and so forth.

Figure 7A:
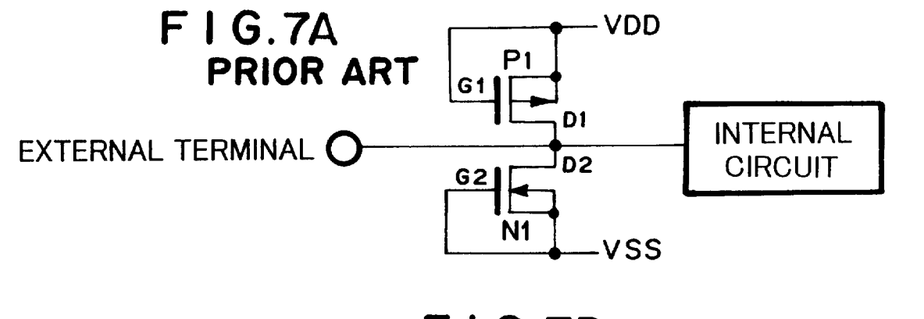
FIG. 7A is an equivalent circuit diagram showing the structure of a conventional protecting circuit.

FIG. 7A is an equivalent circuit showing an example of the structure of a conventional static electricity protecting circuit of such a semiconductor apparatus. Referring to FIG. 7A, the protecting circuit comprises a p channel type MOS transistor P1 and an n channel type MOS transistor N1. A source electrode, a gate electrode, and a substrate electrode of the p channel type MOS transistor P1 are connected to a high voltage power supply VDD. A source electrode, a gate electrode, and a substrate electrode of the n channel type MOS transistor N1 are connected to a low voltage power supply VSS. A drain of the p channel type MOS transistor P1 and a drain of the n channel type MOS transistor N1 are connected. This connected point is connected to an external terminal and an internal circuit of a semiconductor integrated circuit.

Figure 7B:
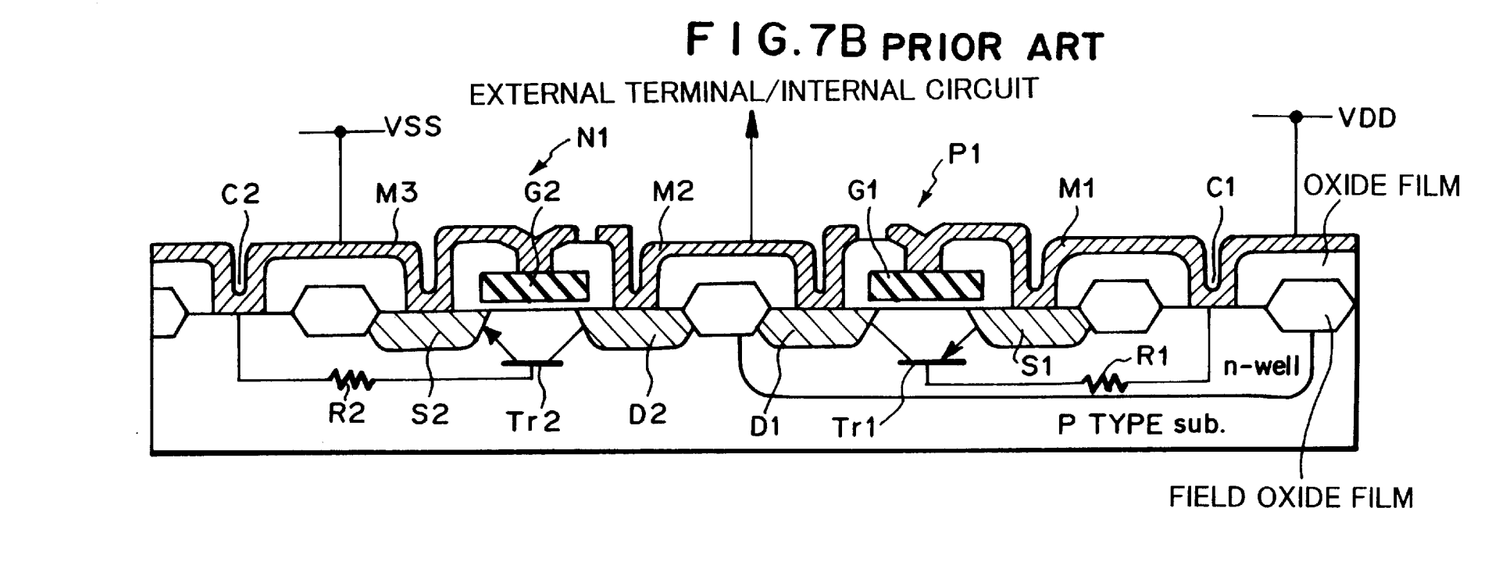
FIG. 7B is a sectional view showing the structure of the conventional protecting circuit.

FIG. 7B is a sectional view showing the structure of the protecting circuit shown in FIG. 7A. Referring to FIG. 7B, a source electrode S1 and a gate electrode G1 of a p channel type MOS transistor P1 formed in an n well region on a p type substrate are connected to a high voltage power supply VDD with a metal wire M1. In addition, the source electrode S1 and the gate electrode G1 are connected to the n well region with a contact C1.

On the other hand, a gate electrode G2 and a source electrode S2 of the n channel type MOS transistor N1 are connected to a low voltage power supply VSS with a metal wire M3. In addition, the gate electrode G2 and the source electrode S2 are connected to a p type substrate with a contact C2.

The drain electrode D1 of the p channel type MOS transistor P1 and the drain electrode D2 of the n channel type MOS transistor N1 are connected to an external terminal and an internal circuit with a metal wire M2. These transistors P1 and N1 are isolated with a field oxide film $SiO_2$. An oxide film is formed on the front surface of these devices including individual electrodes so as to insulate the metal wires from the electrodes of the devices.

When a voltage that is higher than a power supply voltage is applied to the external terminal, the voltage of the n channel type MOS transistor N1 becomes higher than a threshold value and thereby a current flows in the n channel type MOS transistor N1. In contrast, when a voltage lower than VSS is applied to the external terminal, a current flows in the p channel type MOS transistor P1. When an abnormal voltage is applied to the external terminal, a current flows in the n channel type MOS transistor N1 or the p channel type MOS transistor P1 so as to protect the internal circuit.

A pnp type parasitic bipolar transistor Tr1 is formed between the source electrode and the drain electrode of the p channel type MOS transistor P1. A npn type parasitic bipolar transistor Tr2 is formed between the source electrode and the drain electrode of the n channel type MOS transistor N1.

The base voltage of the parasitic transistor Tr2 on the n channel side becomes equal to the voltage of the channel portion ch2. However, since the base electrode and the contact C2 is spaced to some extent, a parasitic resistance R2 takes place therebetween.

When an excessive plus voltage is applied to the drain electrode D2 of the n channel type MOS transistor N1 against the low voltage power supply VSS, an avalanche breakdown current flows at a connection between the n type drain electrode D2 and the p type substrate sub.

Figure 2:
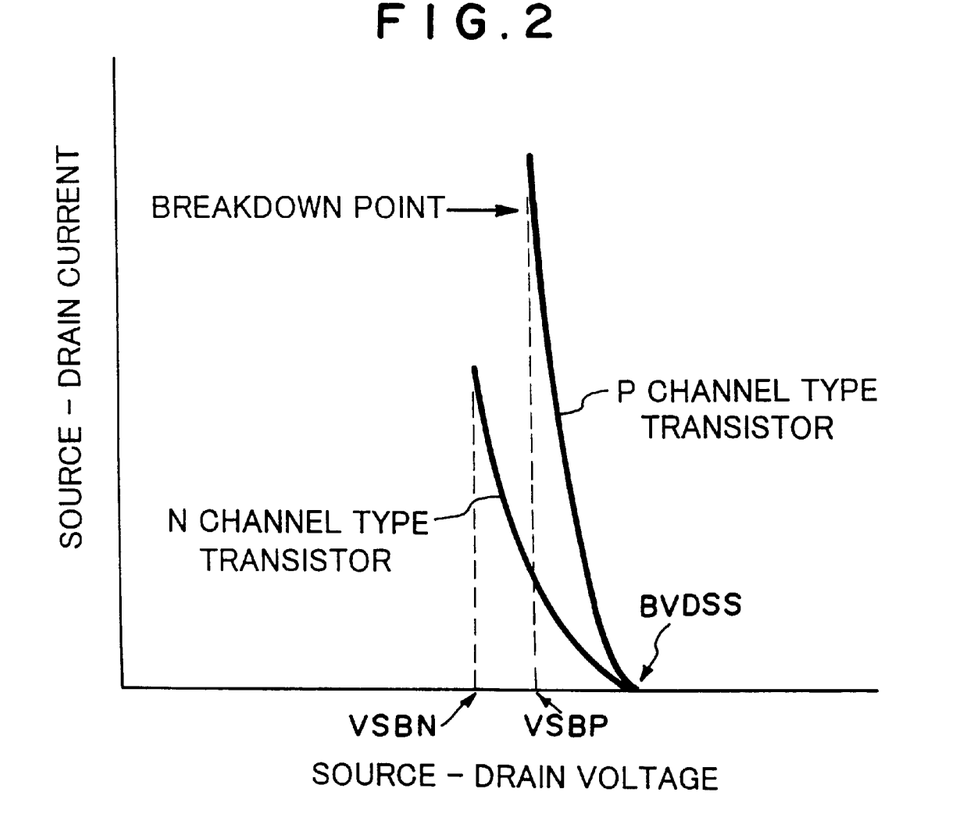
FIG. 2 is a graph showing the relation between a source-drain voltage VDS (on X axis) and a source-drain current IDS (on Y axis) in the case that the snap-back phenomenon takes place.

Since the resistance of the parasitic resistor R2 is not zero, the voltage of the channel portion ch2 (namely, the base voltage of the parasitic transistor Tr2 rises). Thus, the parasitic transistor Tr2 snaps back. FIG. 2 is a graph showing the relation between a source-drain voltage VDS and a source-drain current IDS upon occurrence of snap-back phenomenon. Referring to FIG. 2, the voltage VSBN at which the parasitic transistor Tr2 has snapped back is lower than the voltage BVDSS at the initial stage of the avalanche breakdown.

Thus, the parasitic transistor Tr2 clamps the excessive voltage to the voltage VSBN at which it has snapped back. Likewise, the parasitic transistor Tr1 on the p channel side clamps the excessive voltage to VSBP.

Experimental results of breakdown withstand voltages against static surge and so forth show that parasitic transistors more easily break down in the case that an n channel type transistor snaps back than the case that a p channel type transistor snaps back.

In other words, since a parasitic transistor formed in an n channel type MOS transistor N1 is of npn type, after the parasitic transistor snaps back, it tends to locally heat and break down. Since electrons in a device have higher mobility than holes therein, an npn transistor tends to snap back. In addition, the amplitude hfe of the parasitic transistor largely depends on the temperature. Thus, current and heat tend to concentrate in the parasitic transistor, resulting in a breakdown thereof.

In addition, since two types of an n channel type MOS transistor and a p channel type MOS transistor are used in the protecting circuit, it is difficult to reduce the size thereof.

In other words, since impurities of the drain electrode and the source electrode of an n channel type MOS transistor are different from those of a p channel type MOS transistor, the drain electrode and the source electrode cannot be formed in common.

SUMMARY OF THE INVENTION

The present invention is made from the above described point of view. An object of the present invention is to provide a protecting circuit that hardly breaks down due to static electricity and that does not take up a large area of a chip.

The present invention is a protecting circuit, comprising a plurality of p channel type transistors, wherein a source electrode, a gate electrode, and a substrate electrode of a first p channel type transistor are connected to a high voltage power supply terminal, a drain electrode of a second p channel type MOS transistor being connected to a low voltage power supply terminal, a substrate electrode of the second p channel type substrate being connected to the high voltage power supply terminal, a drain electrode of the first p channel type transistor, a source electrode and a gate electrode of the second p channel type MOS transistor being connected to an external terminal and an internal circuit in common.

The first p channel type transistor and the second p channel type transistor are formed in the same n well region.

The source electrode of the first p channel type transistor and the drain electrode of the second p channel type transistor are formed in the same n well region with the same conductive layer.

These and other objects, features and advantages of the present invention will become more apparent in light of the following detailed description of a preferred embodiment thereof, as illustrated in the accompanying drawings.

DESCRIPTION OF PREFERRED EMBODIMENTS

Figure 1A:
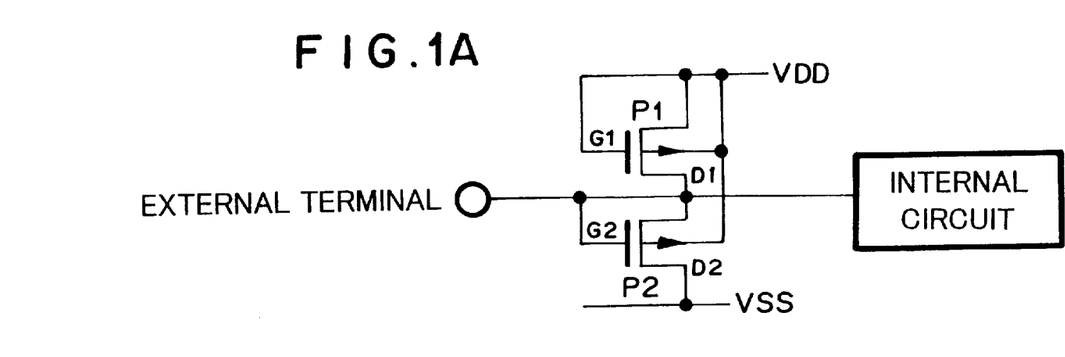
FIG. 1A is an equivalent circuit diagram showing the structure of a protecting circuit according to a first embodiment of the present invention.

Next, with reference to the accompanying drawings, an embodiment of the present invention will be described. FIG. 1A is an equivalent circuit diagram showing the structure of a protecting circuit according to a first embodiment of the present invention. With reference to FIG. 1A, the protecting circuit comprises a p channel type MOS transistor P1 and a p channel type MOS transistor P2. A source electrode, a gate electrode, and a substrate electrode of the p channel type MOS transistor P1 are connected to a high voltage power supply VDD. A drain electrode transistor P2 of the p channel type MOS is connected to a low voltage power supply terminal VSS. A substrate electrode of the p channel type MOS transistor P2 is connected to the high voltage power supply VDD. A drain electrode of the p channel type MOS transistor P1 and a source electrode and a gate electrode of the p channel type MOS transistor P2 are connected to an external terminal and an internal circuit in common.

Figure 1B:
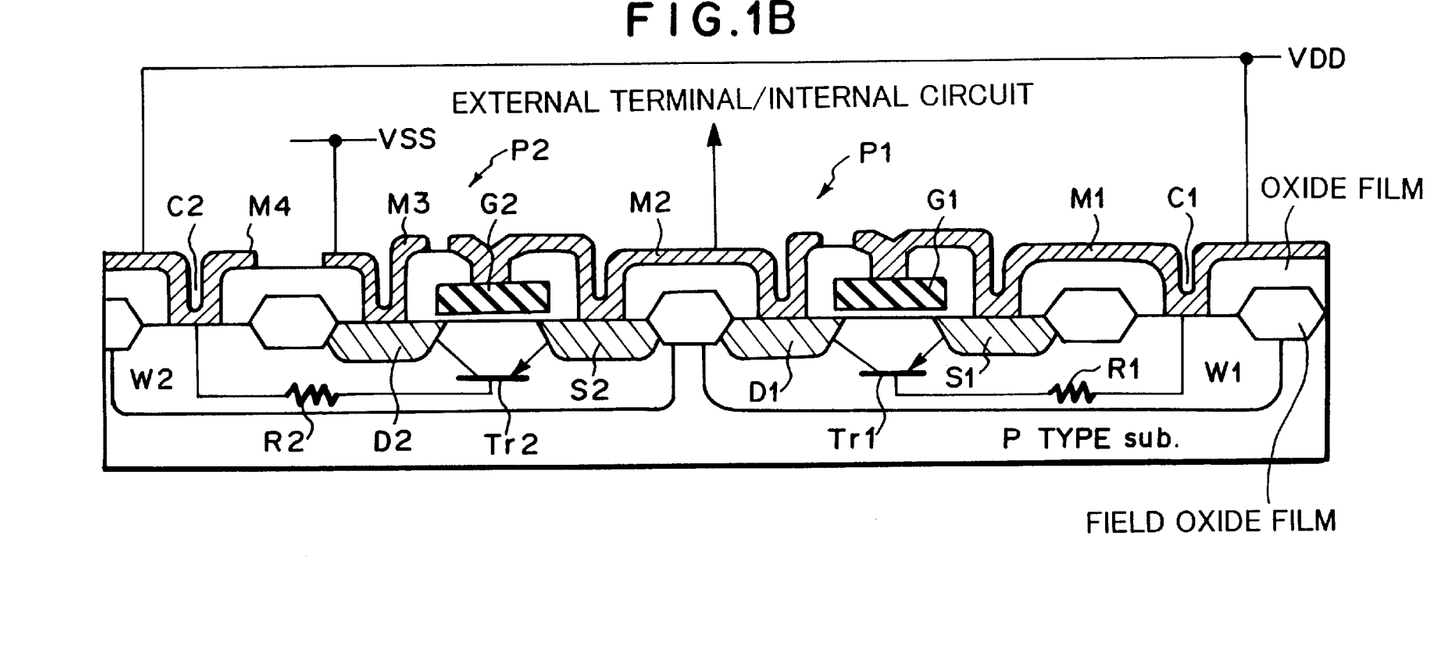
FIG. 1B is a sectional view showing the structure of the protecting circuit according to the first embodiment of the present invention.

FIG. 1B is a sectional view showing the structure of the protecting circuit according to the first embodiment of the present invention. Referring to FIG. 1B, a source electrode S1 and a gate electrode G1 of a p channel type MOS transistor P1 formed in an n well region W1 of a p type substrate p-sub are connected to a high voltage power supply VDD with a metal wire M1. In addition, the source electrode S1 and the gate electrode G1 are connected to the n well region W1 with a contract C1.

Likewise, a gate electrode G2 and a source electrode S2 of a p channel type MOS transistor P2 formed in an n well region W2 adjacent to the p channel type MOS transistor P1 disposed on the p type substrate p-sub are connected to a drain electrode D1 of the p channel type MOS transistor P1 with a metal wire M2. In addition, the gate electrode G2 and the source electrode S2 are connected to an external terminal and an internal circuit in common. A drain electrode D2 of the p channel type MOS transistor P2 is connected to a low voltage power supply VSS with a metal wire M3. In addition, the drain electrode D2 is connected to the n well region with a contact C2.

These MOS transistors are isolated with a field oxide film $SiO_2$. An oxide film is formed on the front surface of these devices including the electrodes so as to insulate the electrodes from the metal wires formed on the oxide film.

A pnp type parasitic resistor Tr1 is formed between the source electrode and the drain electrode of the p channel type MOS transistor P1. A pnp type parasitic transistor Tr2 is formed between the source electrode and the drain electrode of the p channel type MOS transistor P2.

The two MOS transistors P1 and P2 are composed of p type semiconductors of the drain electrodes D1 and D2, p type semiconductors of the source electrodes S1 and S2, and n type semiconductors of the n wells W1 and W2, respectively.

Figure 3A:
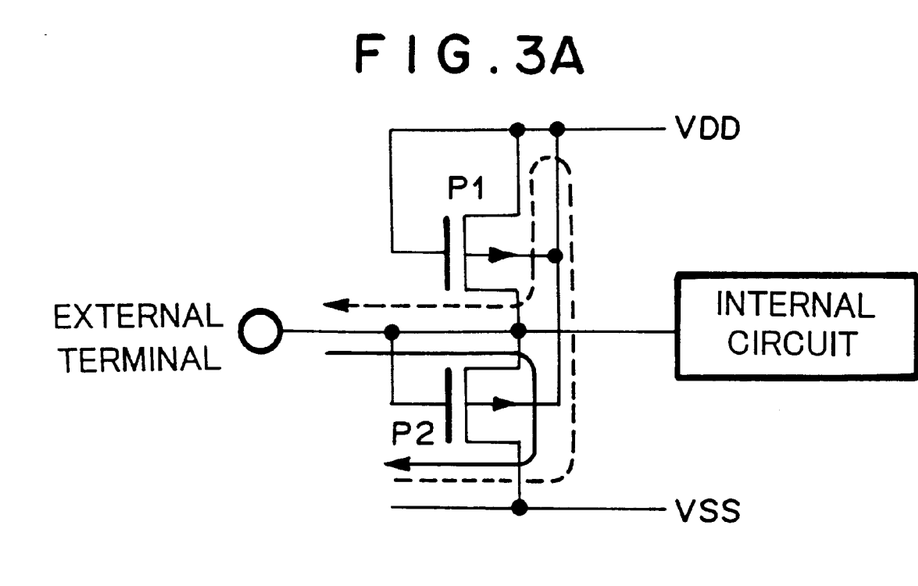
FIG. 3A is an equivalent circuit for explaining static electricity flow to a low voltage power supply VSS.
Figure 3B:
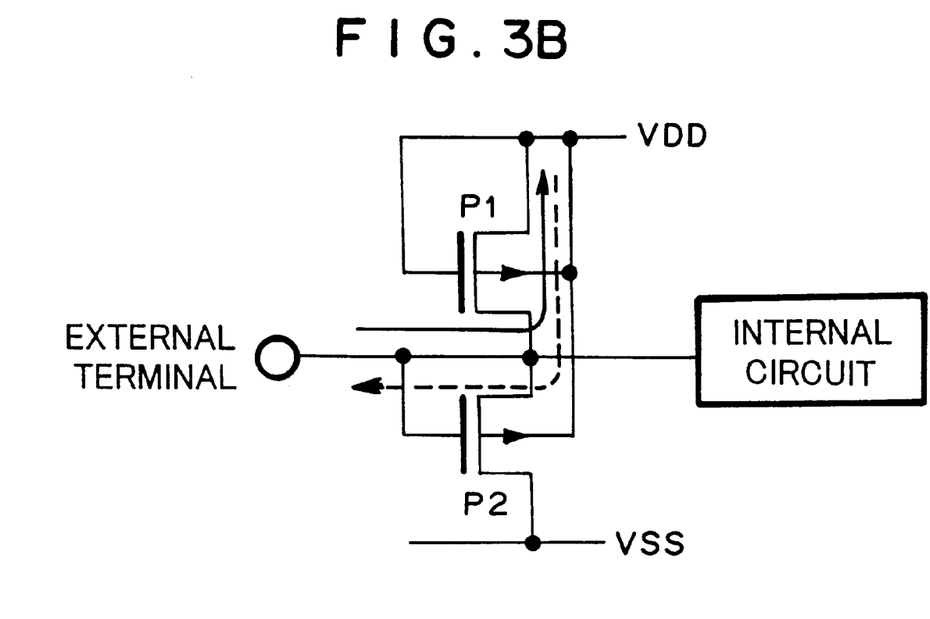
FIG. 3B is an equivalent circuit diagram for explaining static electricity flow to a high voltage power supply VDD.

Next, with reference to FIGS. 1A, 1B, 2, 3A, and 3B, the operation of the protecting circuit according to the first embodiment of the present invention will be described. FIG. 2 is a graph showing the relation between the source-drain voltage VDS (on X axis) and the source-drain current IDS (on Y axis) in the case that the snap-back phenomenon takes place in MOS transistors. FIG. 3A is an equivalent circuit diagram for explaining the static electricity flow to the low voltage power supply VSS. FIG. 3B is an equivalent circuit diagram for explaining the static electricity flow to the high voltage power supply VDD.

Referring to FIG. 2, assuming that the withstand voltage of a p-n junction is denoted by BVDSS, the snap-back characteristics of a p channel type transistor sharply deteriorates to a breakdown point VSBP when the source-drain voltage exceeds the p-n junction withstand voltage BVDSS.

Likewise, the snap-back characteristics of an n channel type transistor sharply deteriorates to a breakdown point VSBN when the source-drain voltage exceeds the p-n junction withstand voltage BVDSS. Thus, it is clear that the source-drain current at the breakdown point VSBN of the n channel type transistor is lower than the source-drain current at the breakdown point VSBP of the p channel type transistor.

Assuming that an excessive voltage such as static electricity is applied to the external terminal, there are two current paths to the low voltage power supply VSS and the high voltage power supply VDD. In addition, the applied voltage is a plus voltage or a minus voltage.

Referring to FIG. 3A, when a plus voltage is applied to the external terminal, as represented by a solid line, a current flows from the external terminal, to the source electrode S2 of the p channel type MOS transistor P2, to the emitter electrode of the pnp type parasitic transistor Tr2, to the collector electrode, to the drain electrode D2 of the p channel type MOS transistor P2, to the low voltage power supply VSS. In this case, since the pnp type parasitic transistor Tr2 of the p channel type transistor P2 has the above-described snap-back characteristics, it clamps the excessive voltage at the breakdown point VSBP shown in FIG. 2.

There is the relation of the breakdown points VSBP<BVDSS. In addition, the breakdown point VSBP is designated to a lower voltage than the breakdown voltage of the gate oxide film of transistors used in the internal circuit.

When a minus voltage is applied to the external terminal, as represented by a dotted line in FIG. 3A, a current flows from the low voltage power supply VSS, to the drain electrode D2 of the p channel type MOS transistor P2, to the n well region W2, to the metal wire M4, to the high voltage power supply VDD, to the source electrode S1 of the p channel type transistor P1, to the emitter electrode of the pnp type parasitic transistor Tr1, to the collector electrode, to the drain electrode D1 of the p type channel type transistor P1, to the external terminal.

In this case, since the parasitic transistor Tr1 of the p channel type transistor P1 has the above-described snap-pack characteristics, it clamps the excessive voltage at the breakdown point VSBP shown in FIG. 2.

Referring to FIG. 3B, when a plus voltage is applied to the external terminal, as represented by a solid line, a current flows from the external terminal, to the drain electrode D1 of the p channel type transistor P1, to the n well, to the contact C1, to the high voltage power supply VDD. In this case, since the pn junction of the drain electrode D1 of the p channel type transistor P1 is in the forward direction, the clamp voltage becomes around the forward voltage of the pn junction.

On the other hand, when a minus voltage is applied to the external terminal, as represented by a dotted line in FIG. 3B, a current flows from the high voltage power supply VDD, to the source electrode S1 of the p channel transistor P1, to the emitter electrode of the pnp type parasitic transistor Tr1, to the collector electrode, to the drain electrode D1 of the p channel type transistor P1, to the external terminal.

In this case, since the parasitic transistor Tr1 of the p channel type transistor P1 has the above-described snap-back characteristics, it clamps the excessive voltage at the bread-down point VSBP shown in FIG. 2.

In other words, when a parasitic transistor snaps back and thereby clamps an excessive voltage, the parasitic transistor should be prevented from breaking down.

The above-described snap-back characteristics show that after an n channel type transistor snaps back and thereby the breakdown voltage drops from BVDSS to VSBN, it tends to break down. In contrast, a p channel type transistor can withstand a drain-source current IDS twice that of an n channel type transistor.

Thus, even if a parasitic transistor is present in a current path, the protecting circuit itself does not break down.

The present invention is made in view of the fact that a p channel type transistor breaks down less than an n channel type transistor. However, it should be noted that with a conventional silicon CMOS process, the similar effect can be obtained.

Thus, such a protecting circuit can be composed of two p channel type transistors formed in the silicon CMOS process and metal wires M1, M2, M3, and M4 as shown in FIG. 1.

However, to obtain the function of the protecting circuit, the breakdown point VSBP of the two p channel type transistors should be lower than the breakdown voltage of the internal circuit or the avalanche breakdown voltage.

Figure 4:
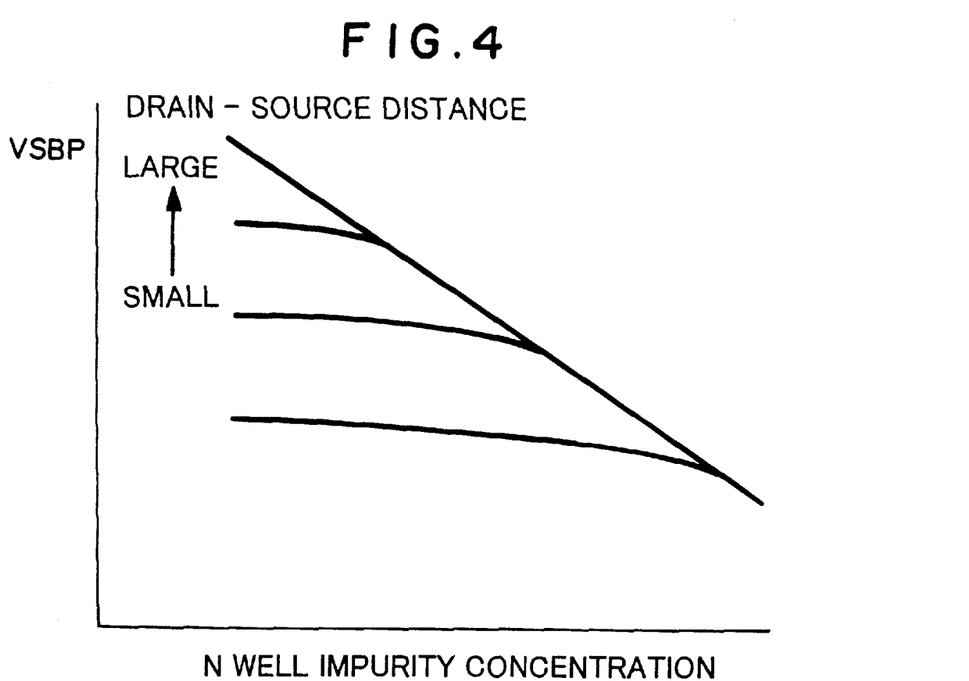
FIG. 4 is a graph showing the dependency of a breakdown point VSBP against the structure of a transistor.

FIG. 4 is a graph showing that the breakdown point VSBP depends on the structure of a transistor. Referring to FIG. 4, the breakdown point VSBP depends on the impurity concentration of the n well and the distance between the drain electrode and the source electrode of a transistor. Thus, it is clear that the breakdown point VSBP is reversely proportional to the impurity concentration of the n well and is proportional to the distance between the drain electrode and the source electrode of a transistor.

In addition, the breakdown point VSBP is reversely proportional to the protection effect. However, the breakdown point VSBP should be designated to a voltage larger than the range of the operation voltages of the internal circuit.

Figure 5:
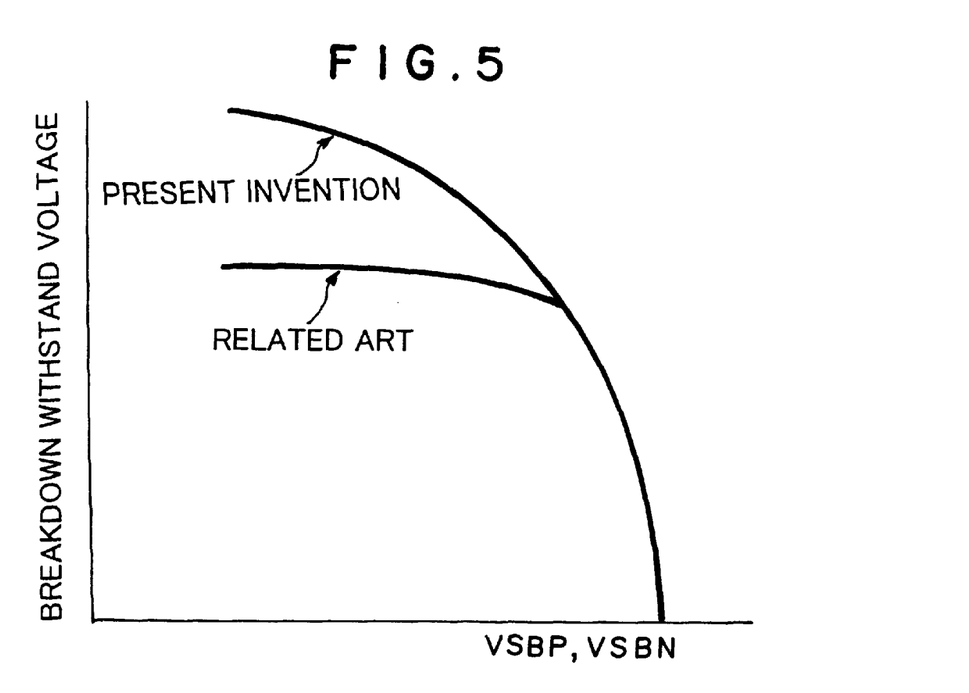
FIG. 5 is a graph showing the relation between the breakdown point VSBP and a breakdown withstand voltage.

FIG. 5 is a graph showing the relation between the breakdown point VSBP and the breakdown withstand voltage. Referring to FIG. 5, according to the embodiment of the present invention, the breakdown withstand voltage is reversely proportional to the breakdown point VSBP. However, when the breakdown point VSBP exceeds the breakdown voltage of the internal circuit, the effect of the protection circuit is lost.

In the conventional protecting circuit, when the breakdown voltage VSBN of the n channel type transistor is low, the protecting circuit breaks down before the internal circuit does. Thus, the effect of the protecting circuit is low.

Figure 6:
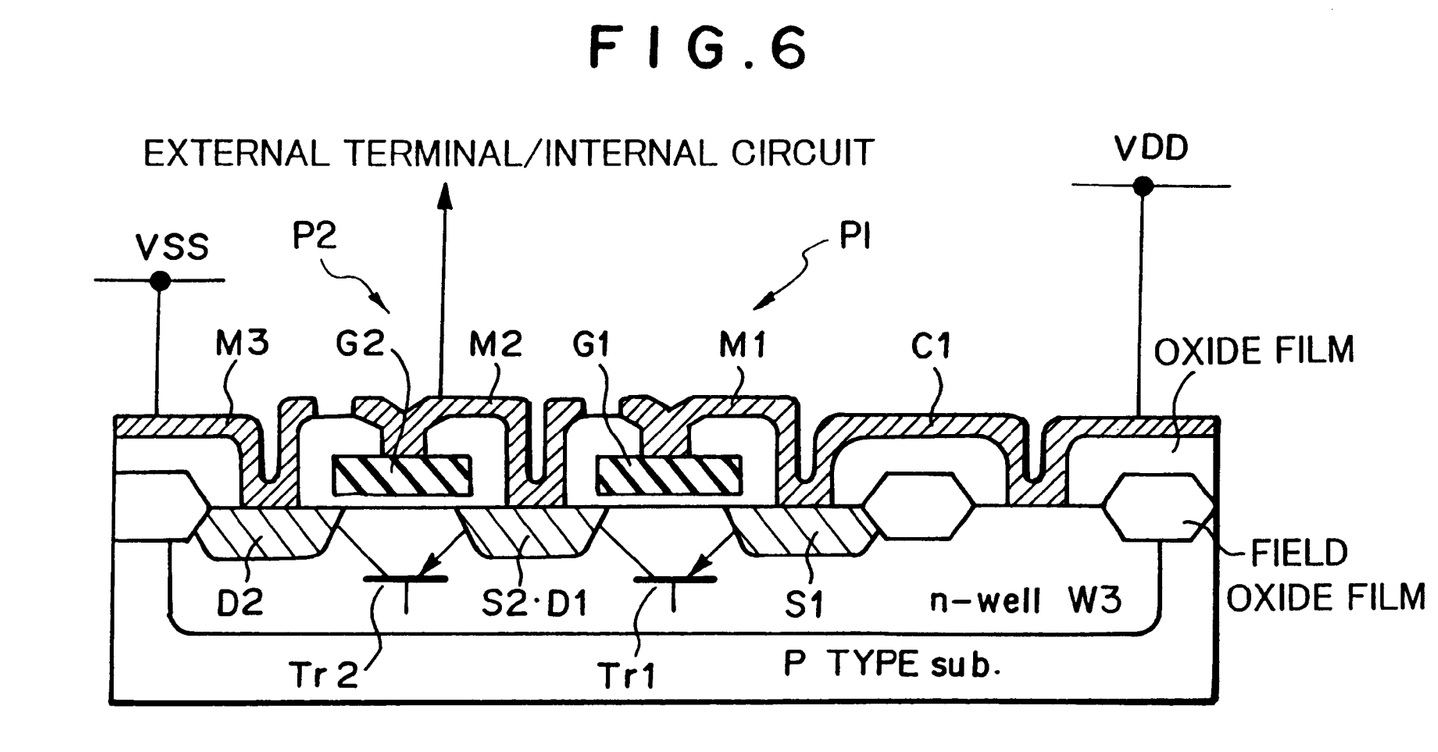
FIG. 6 is a sectional view showing the structure of a protecting circuit according to a modification of the first embodiment of the present invention.

FIG. 6 is a sectional view showing the structure of a protecting circuit according to a modification of the first embodiment of the present invention. Referring to FIG. 6, p channel type transistors P1 and P2 are adjacently formed in the same n well region W3 on a p type substrate p-sub. A drain electrode of the p channel type transistor P1 and a source electrode of the p channel type transistor P2 are formed in the same p type diffusion region DS. A source electrode S1 and a gate electrode G1 of the p channel type transistor P1 are connected with a metal wire M1. In addition, the source electrode S1 and the gate electrode G1 are connected to an n well region W3 with a contact C1 and also connected to the high voltage power supply VDD. The p type diffusion region S2.D1 in which the source electrode S2 of the p channel type transistor P2 and the drain electrode D1 of the p channel type transistor P1 are formed in common is connected to a gate electrode G2 of the p channel type MOS transistor P2. In addition, the p type diffusion region S2.D1 is connected to an external terminal and an internal circuit. A drain electrode D2 of the p channel type MOS transistor P2 is connected to a low voltage power supply VSS with a metal wire M3.

A p type region and an n type region of these transistors are isolated with a field oxide film SiO$_2$. The front surface of the devices including the electrodes thereof is insulated from the metal wires with an oxide film.

A pnp parasitic transistor Tr1 is formed between the source electrode and the drain electrode of the p channel type transistor P1. A pnp type parasitic transistor Tr2 is formed between the source electrode and the drain electrode of the p channel type transistor P1.

In the modification of the first embodiment of the present invention, the p channel type transistors P1 and P2 of the first embodiment are formed in the same n well region W3. The source electrode of the p channel type transistor P1 and the drain electrode of the p channel type transistor P2 are formed in common. Moreover, the p channel type transistors P1 and P2 are formed in the n well region. Thus, the protecting circuit does not take up a large area in a chip.

Referring to FIG. 3A and 6, when a plus voltage is applied to the external terminal, a current flows from the external terminal, to the metal wire M2, to the common electrode S2.D1 of the p channel type transistors P1 and P2, to the emitter electrode of the pnp type parasitic transistor Tr2, to the drain electrode D2 of the p channel type transistor P2, to the metal wire M3, to the low voltage power supply VSS. In this case, as with the first embodiment, the parasitic transistor Tr2 of the p channel type MOS transistor P2 clamps an excessive voltage at the breakdown pointer VSBP shown in FIG. 2.

On the other hand, when a minus voltage is applied to the external terminal, a current flows from the low voltage power supply VSS, to the metal wire M3, to the drain electrode D2 of the p channel type transistor P2, to the n well region W3, to the contact C1, to the source electrode S1 of the p channel type transistor P1, to the emitter electrode of the pnp type parasitic transistor Tr1, to the collector electrode, to the common electrode S2.D1 of the p channel type transistors P1 and P2, to the external terminal. In this case, the parasitic transistor Tr1 of the p channel type transistor P1 clamps an excessive voltage at the breakdown point shown in FIG. 2.

Referring to FIGS. 3B and 6, when a plus voltage is applied to the external terminal, a current flows from the external terminal, to the metal wire M2, to the common electrode S2.D1 of the p channel type transistors P1 and P2, to the n well region W3, to the contact C1, to the high voltage power supply VDD. In this case, since the pn junction of the common electrode S2.D1 of the p channel type transistors P1 and P2 and the n well region W3 is in the forward direction, the clamp voltage is around the forward voltage of the pn junction.

When a minus voltage is applied to the external terminal, a current flows from the high voltage power supply VDD, the source electrode S1 of the p channel type transistor P1, to the emitter electrode of the pnp type parasitic transistor Tr1, to the collector electrode, to the common electrode S2.D1 of the p channel type transistors P1 and P2, to the metal wire M2, to the external terminal.

In this case, the parasitic transistor Tr1 of the p channel type transistor P1 clamps an excessive voltage at the breakdown point VSBP shown in FIG. 2.

In this modification of the first embodiment of the present invention, even if a current twice the drain-source current IDS flows in the p channel type transistor, it does not break down. Thus, even if a parasitic transistor is present in a current path, the protecting circuit itself does not break down.

As described above, a protecting circuit according to the present invention comprises a plurality of p channel type transistors, wherein a source electrode, a gate electrode, and a substrate electrode of a first p channel type transistor are connected to a high voltage power supply terminal; a drain electrode of a second p channel type MOS transistor is connected to a low voltage power supply terminal; a substrate electrode of the second p channel type substrate is connected to the high voltage power supply terminal; a drain electrode of the first p channel type transistor, a source electrode and a gate electrode of the second p channel type MOS transistor are connected to an external terminal and an internal circuit in common. Thus, since instead of n channel type transistors that easily break down, p channel type transistors that hardly break down are used, a protecting circuit that hardly breaks down can be accomplished.

In addition, since the static electricity protecting circuit composed of a plurality of p channel type transistors is formed in the same n well region, the source electrode of the p channel type transistor P1 and the drain electrode of the p channel type MOS transistor P2 are structured in common. In addition, the n well region W3 is shared by the p channel type transistors P1 and P2. Thus, a protecting circuit that does not take up a large area in a chip can be provided.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A protecting circuit, comprising:
   a plurality of p channel type transistors,
   wherein:
   a source electrode, a gate electrode, and a substrate electrode of a first p channel type transistor are connected to a high voltage power supply terminal;
   a drain electrode of a second p channel type transistor is connected to a low voltage power supply terminal;
   a substrate electrode of the second p channel type transistor is connected to the high voltage power supply terminal;
   a drain electrode of the first p channel type transistor, a source electrode and a gate electrode of the second p channel type transistor are connected to an external terminal and to an internal circuit.

2. The protecting circuit as set forth in claim 1, wherein the first p channel type transistor and the second p channel type transistor are formed in the same n well region.

3. The protecting circuit as set forth in claim 1, wherein the source electrode of the second p channel type transistor and the drain electrode of the first p channel type transistor are formed in the same n well region with the same conductive layer.

4. A protecting circuit, comprising:
   a first transistor having a first source electrode, a first drain electrode and a first gate electrode, said first source electrode being of a first conductive type formed in a first well region of a second conductive type disposed on a semiconductor substrate of the first conductive type;
   a first electric connection connecting said first source electrode, said first gate electrode, said first well region and a high voltage power supply;
   a second transistor having a second source electrode, a second drain electrode and a second gate electrode, said second source electrode being of the first conductive type formed in a second well region of the second conductive type, the second well region being adjacent to the first well region;

a second electric connection connecting said first drain electrode, said second source electrode and said second gate electrode; and a third electric connection between said second drain electrode and a low voltage power supply, wherein the second well region and said first electric connection are connected, and wherein said second electric connection is connected to input and output terminals of a semiconductor circuit.

5. The protecting circuit as set forth in claim 4, wherein a parasitic transistor is formed in such a manner that the first source electrode and the first drain electrode of the first transistor are an emitter electrode and a collector electrode of a third transistor, respectively, and that the well region is a base electrode of the third transistor.

6. A protecting circuit, comprising:

a first transistor having a first source electrode, a first drain electrode and a first gate electrode, said first transistor being of a first conductive type formed in a well region of a second conductive type disposed on a semiconductor substrate of the first conductive type;

a first electric connection connecting said first source electrode, said first gate electrode, said well region and a high voltage power supply;

a second electric connection between a second source electrode and a second gate electrode of a second transistor of the first conductive type, wherein the first drain electrode of the first transistor and the second source electrode of the second transistor are formed in common; and a third electric connection between a second drain electrode of the second transistor and a low voltage power supply, wherein the second electric connection is connected to input and output terminals of a semiconductor circuit.

7. The protecting circuit as set forth in claim 6, wherein a parasitic transistor is formed in such a manner that the first source electrode and the first drain electrode of the first transistor are an emitter electrode and a collector electrode of a third transistor, respectively, and that the well region is a base electrode of the third transistor.

8. The protecting circuit as set forth in claim 4 wherein said first, second and third electric connections are metal wires.

9. The protecting circuit as set forth in claim 6 wherein said first, second and third electric connections are metal wires.

* * * * *